(12) United States Patent
Hinata et al.

(10) Patent No.: US 11,133,609 B2
(45) Date of Patent: Sep. 28, 2021

(54) SEMICONDUCTOR DEVICE HAVING TERMINAL PIN CONNECTED BY CONNECTING MEMBER AND METHOD OF MANUFACTURING SEMICONDUCTOR DEVICE

(71) Applicant: FUJI ELECTRIC CO., LTD., Kawasaki (JP)

(72) Inventors: Yuichiro Hinata, Matsumoto (JP); Tatsuo Nishizawa, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/523,772

(22) Filed: Jul. 26, 2019

(65) Prior Publication Data
US 2020/0091634 A1    Mar. 19, 2020

(30) Foreign Application Priority Data
Sep. 14, 2018    (JP) .............................. JP2018-172439

(51) Int. Cl.
| | |
|---|---|
| *H01R 12/58* | (2011.01) |
| *H01L 23/492* | (2006.01) |
| *H01R 43/20* | (2006.01) |
| *H01L 21/48* | (2006.01) |
| *H01R 13/03* | (2006.01) |

(52) U.S. Cl.
CPC ......... *H01R 12/58* (2013.01); *H01L 21/4853* (2013.01); *H01L 23/492* (2013.01); *H01R 13/03* (2013.01); *H01R 43/205* (2013.01)

(58) Field of Classification Search
CPC .......... H01L 21/4853; H01L 23/49811; H01L 23/492; H01L 21/48; H01R 12/58; H01R 43/205; H01R 13/03; H01R 3/20; H01R 32/20
USPC ........................................................ 257/734
See application file for complete search history.

(56) References Cited

U.S. PATENT DOCUMENTS

| | | | |
|---|---|---|---|
| 6,339,257 B1 * | 1/2002 | Fujiki ..................... | H01L 24/05 257/751 |
| 2009/0085189 A1 * | 4/2009 | Thoben ............. | H01L 23/49811 257/693 |
| 2009/0194884 A1 | 8/2009 | Stolze | |
| 2009/0242262 A1 * | 10/2009 | Asano .................... | H05K 3/303 174/267 |
| 2010/0052153 A1 * | 3/2010 | Koizumi ............. | H01L 21/4853 257/697 |

(Continued)

FOREIGN PATENT DOCUMENTS

| | | |
|---|---|---|
| JP | 2001-251726 A | 9/2001 |
| JP | 2011-114158 A | 6/2011 |
| JP | 2015-179646 A | 10/2015 |

*Primary Examiner* — Alexander O Williams
(74) *Attorney, Agent, or Firm* — Rabin & Berdo, P.C.

(57) ABSTRACT

A semiconductor device includes: an insulation circuit substrate including a metal layer and an insulation substrate, the metal layer being formed on one surface of the insulation substrate, a connecting member having a cylindrical shape joined to the metal layer via a bonding material, a terminal pin inserted in the connecting member, and a reinforcement member having a cylindrical shape disposed on an outer periphery of the connecting member. The reinforcement member is made of a material having a hardness greater than that of the connecting member.

17 Claims, 6 Drawing Sheets

(56) References Cited

U.S. PATENT DOCUMENTS

| | | | | |
|---|---|---|---|---|
| 2012/0186864 A1* | 7/2012 | Inoue | ............... | B23K 35/22 |
| | | | | 174/258 |
| 2018/0190554 A1* | 7/2018 | Adachi | ............... | H01L 24/01 |
| 2019/0088575 A1* | 3/2019 | Kato | ............... | H01L 24/69 |
| 2019/0189529 A1* | 6/2019 | Nishida | ............... | H05K 1/119 |
| 2019/0273041 A1* | 9/2019 | Nishizawa | ............... | H01L 23/50 |
| 2019/0371932 A1* | 12/2019 | Hashizume | ............... | H01L 29/66068 |
| 2019/0386403 A1* | 12/2019 | Lee | ............... | C08G 18/3206 |
| 2020/0365726 A1* | 11/2020 | Hoshi | ............... | H01L 29/7804 |

\* cited by examiner

SEMICONDUCTOR DEVICE HAVING TERMINAL PIN CONNECTED BY CONNECTING MEMBER AND METHOD OF MANUFACTURING SEMICONDUCTOR DEVICE

CROSS REFERENCE TO RELATED APPLICATION

This application is based upon and claims the benefit of priority from the prior Japanese Patent Application No. 2018-172439, filed on Sep. 14, 2018; the entire contents of which are incorporated herein by reference.

BACKGROUND OF THE INVENTION

Field of the Invention

The present invention relates to a semiconductor device and a method of manufacturing a semiconductor device.

Description of the Related Art

Conventionally, the following methods for connecting a terminal pin to a substrate or an external terminal have been proposed (see, e.g., PTLS 1 to 4).

PTL 1 discloses a structure for connecting a terminal drawn from a circuit substrate and a bus bar. A cylindrical auxiliary connection terminal is connected to the bus bar by swaging, and a round pin terminal projecting from the circuit substrate is inserted to the auxiliary connection terminal. The auxiliary connection terminal is threaded and grooved, and the connection between the round pin terminal and the auxiliary connection terminal can be augmented by tightening the auxiliary connection terminal with a nut from the outer side.

PTL 2 discloses a structure for fixing a long rod-shaped connection terminal to a through hole of a printed substrate. The connection terminal has an outer diameter smaller than the inner diameter of the through hole, and is partially radially protruded for positioning. By filling the gap of the through hole with solder in the state where the connection terminal is inserted to the through hole, the connection terminal and the printed substrate are fixed.

PTLS 3 and 4 disclose a semiconductor device in which a connection pin for external connection is disposed to an insulation circuit substrate. A connection tube provided with a flange formed at an end portion is provided to the surface of the insulation circuit substrate by soldering, and the connection pin is press-fitted to the connection tube, to thereby fix the connection pin and the insulation circuit substrate.

CITATION LIST

Patent Literature

PTL 1: Japanese Patent Application Laid-Open Publication No. 2001-251726
PTL 2: Japanese Patent Application Laid-Open Publication No. 2011-114158
PTL 3: Japanese Patent Application Laid-Open Publication No. 2015-179646
PTL 4:
US Patent Application Publication No. 2009/0194884

In PTL 1, the auxiliary connection terminal to which the round pin terminal is connected is grooved, and as such, when, for example, working of a pipe material of φ2 mm or smaller is performed, the working is complicated and cost is increased, and further, the strength of the auxiliary connection terminal itself may be reduced. In addition, in the case where a connection pin is press-fitted to the connection tube as in PTLS 3 and 4, when a pure metal is used as the material of the connection tube for the purpose of ensuring conductivity, the rigidity of the connection tube may not be ensured, and the adhesion with the connection pin may be impaired.

In view of the foregoing, an object of the present invention is to provide a semiconductor device and a method of manufacturing a semiconductor device that can ensure adhesion between a terminal pin and a connecting member to which the terminal pin is inserted.

SUMMARY OF THE INVENTION

A semiconductor device according to an aspect of the present invention includes: an insulation circuit substrate including an insulation substrate and a metal layer, the metal layer being provided on one surface of the insulation substrate, a connecting member having a cylindrical shape, joined to the metal layer via a bonding material, a terminal pin inserted in the connecting member, and a reinforcement member having a cylindrical shape, disposed on an outer periphery of the connecting member, the reinforcement member being made of a material having a hardness greater than a hardness of a material of the connecting member. The reinforcement member is made of a material harder than that of the connecting member.

A method of manufacturing a semiconductor device according to an aspect of the present invention includes: preparing an insulation circuit substrate including an insulation substrate, and a metal layer formed on the insulation substrate, preparing a terminal pin, preparing a connecting member having a cylindrical shape, preparing a reinforcement member having a cylindrical shape, and being made of a material having a hardness greater than a hardness of the connecting member, fitting the reinforcement member to an outer periphery of the connecting member, disposing the connecting member to which the reinforcement member is fitted, on the metal layer via a bonding material, fixedly joining the connecting member to the metal layer by heating and melting the bonding material and then cooling and solidifying the bonding material, and press-fitting the terminal pin to the connecting member.

A method of manufacturing a semiconductor device according to an aspect of the present invention includes: preparing an insulation circuit substrate in which a metal layer is formed on one surface of an insulation substrate, preparing a terminal pin, preparing a connecting member having a cylindrical shape, preparing a reinforcement member having a cylindrical shape, and being made of a material having a hardness greater than a hardness of the connecting member, disposing the connecting member on the metal layer via a bonding material, fixedly joining the connecting member to the metal layer by heating and melting the bonding material and then cooling and solidifying the bonding material, inserting the terminal pin to the connecting member fixed to the metal layer, and press-fitting the reinforcement member to an outer periphery of the connecting member.

According to the present invention, adhesion between a terminal and a connecting member to which the terminal is inserted can be ensured.

DETAILED DESCRIPTION OF THE PREFERRED EMBODIMENTS

Figure 1A:
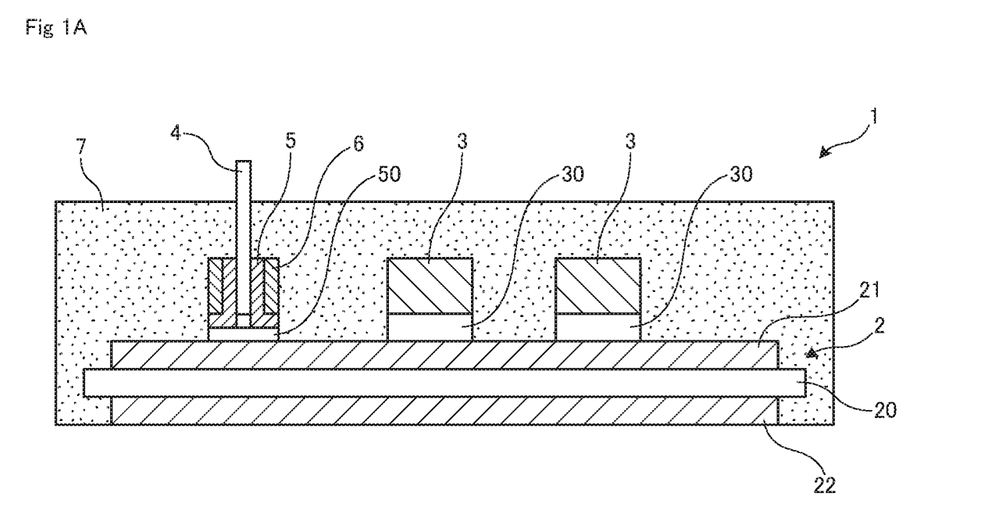
FIGS. 1A and 1B are schematic cross-sectional views illustrating an exemplary semiconductor device according to a present embodiment.
Figure 1B:
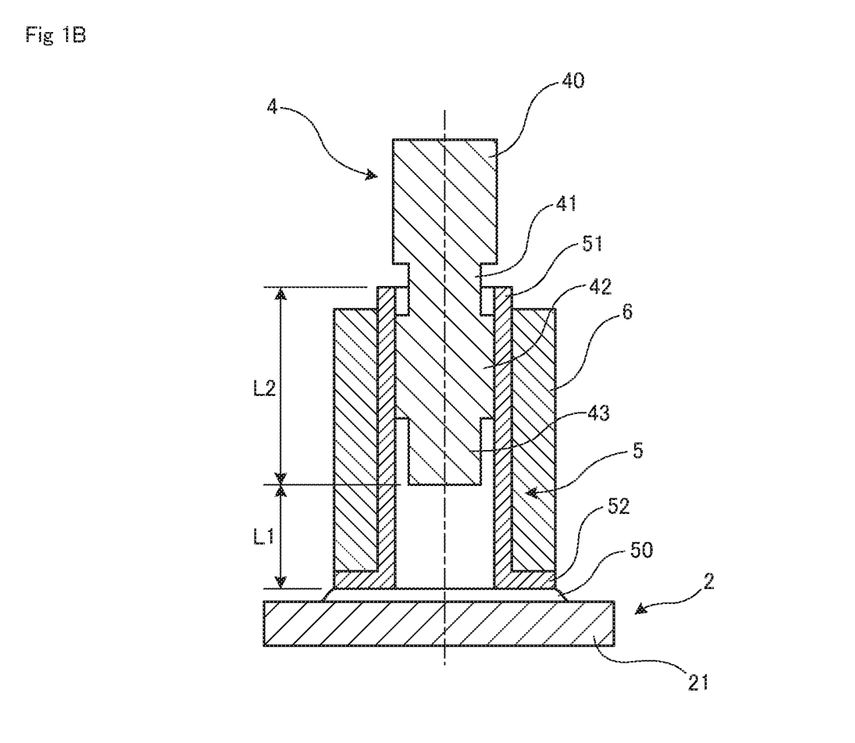

A semiconductor device to which the present invention can be applied is described below. FIGS. 1A and 1B are schematic cross-sectional views illustrating an exemplary semiconductor device according to the present embodiment. FIG. 1A is a schematic view illustrating an entirety of the semiconductor device, and FIG. 1B is an enlarged schematic view illustrating a detailed configuration in a region around a terminal pin illustrated in FIG. 1A. Note that the following semiconductor device is merely an example. The semiconductor device is not limited to this, and may be appropriately modified.

As illustrated in FIG. 1A, a semiconductor device 1 includes an insulation circuit substrate 2, a semiconductor chip 3, and a terminal pin 4. The insulation circuit substrate 2 has a laminated configuration with a metal layer and an insulation layer. Specifically, the insulation circuit substrate 2 includes an insulation substrate 20, a metal layer 21 (circuit layer) formed on an upper surface (one surface) of the insulation substrate 20, and a metal layer 22 (heat dissipation layer) formed on a lower surface (the other surface) of the insulation substrate 20. A circuit pattern is formed by the metal layer 21.

The semiconductor chip 3 is, for example, made of a semiconductor substrate of silicon (Si), silicon carbide (SiC) or the like in a square shape as viewed in top view, and, for example, two semiconductor chips 3 are provided. An electrode (not illustrated in the drawing) is formed on the upper surface of each semiconductor chip 3. Each semiconductor chip 3 is disposed on the metal layer 21 via a bonding member (bonding material) 30 such as solder therebetween.

Note that, as the semiconductor chip 3, a switching device such as an IGBT (Insulated Gate Bipolar Transistor) and a power MOSFET (Metal Oxide Semiconductor Field Effect Transistor), and a diode such as a FWD (Free Wheeling Diode) are used. In addition, as the semiconductor chip 3, an RC (Reverse Conducting)-IGBT in which an IGBT and an FWD are integrated, an RB (Reverse Blocking)-IGBT having sufficient pressure-resistance against reverse bias and the like may also be used.

The terminal pin 4 is a terminal (which may be referred to as an external terminal) that electrically connects an external electrode (not illustrated in the drawing) and the metal layer 21, and is formed in a rod shape with a metal material such as a copper alloy metal. The terminal pin 4 is connected with the metal layer 21 with a connecting member 5 (which may be referred to as a sleeve) therebetween.

The connecting member 5 is formed in a cylindrical shape, and a top end of the terminal pin 4 is inserted or press-fitted into the connecting member 5. The connecting member 5 is a conductive material made of a metal material such as copper, and is joined to the metal layer 21 via a bonding member 50 such as solder therebetween. As well as pure copper (oxygen-free copper), a copper-containing metal and the like may be adopted as the material of the connecting member 5. The connecting member 5 is made of a material whose conductivity is higher than that of a reinforcement member 6 described later. In addition, details of the shape of the connecting member 5 are described later.

The reinforcement member 6 having a cylindrical shape is fitted to the outer periphery of the connecting member 5. As specifically described later, the reinforcement member 6 reinforces the adhesion between the terminal pin 4 and the connecting member 5. The reinforcement member 6 is a conductive material made of a metal material such as copper, and the material of the reinforcement member 6 is made of a copper-containing metal harder than the connecting member 5, for example. Specifically, a material whose Vickers hardness is higher than that of the connecting member 5 is used for the reinforcement member 6, and it is possible to adopt, as well as the copper-containing metal, tungsten and alloys thereof and the like. Note that the reinforcement member 6 is made of a material whose conductivity is lower than that of the connecting member 5. The reinforcement member 6 is not limited to the conductive material, and may be made of an insulator such as ceramic.

The entirety of the semiconductor device 1 having the above-mentioned configuration is sealed with a sealing member 7 made of an epoxy resin or the like, and the other end (upper end) of the terminal pin 4 protrudes to the outside of the sealing member 7.

Incidentally, in the case where a terminal pin is connected to an insulation circuit substrate with a connecting member such as the above-mentioned sleeve therebetween, it is preferable that the sleeve be made of a material having a relatively high conductivity. It is conceivable to use pure copper such as oxygen-free copper as a material having a high conductivity, for example; however, pure copper does not contain impurities and is therefore relatively soft. As such, the rigidity of the sleeve at the time when the terminal pin is press-fitted may not be ensured, and sufficient adhesion between the terminal pin and the sleeve may not be obtained. In view of this, conventionally, to ensure the adhesion, a copper alloy that is relatively hard is adopted as the material of the sleeve. However, since copper alloys contain impurities, the conductivity is lower than that of pure copper, and the conductivity of the terminal pin may be affected. That is, conventionally, it is difficult to achieve both the adhesion and the conductivity at the same time.

In view of this, the inventor has achieved the present invention by paying attention to the conductivity of the terminal pin and the adhesion between the terminal pin and the sleeve. Specifically, in the present embodiment, the reinforcement member 6 having a cylindrical shape harder than the connecting member 5 is disposed on the outer periphery of the connecting member 5 (sleeve) in which the terminal pin 4 is inserted. With this configuration, the outer periphery of the connecting member 5 is reinforced with the reinforcement member 6 having a higher hardness, and thus it is possible to select the material of the connecting member 5 by giving a higher priority to the conductivity than the hardness. By using a material such as pure copper having a high conductivity for the connecting member 5 as described above, the electric resistance of the connecting member 5 can be reduced, and generation of Joule heat upon energization can be suppressed. In addition, with the configuration in which the reinforcement member 6 is made of a material harder than that of the connecting member 5, deformation of the connecting member 5 at the time when the terminal pin 4 is inserted (press-fitted) to the connecting member 5 can be suppressed with the reinforcement member 6. Thus, both the conductivity and the adhesion between the terminal pin 4 and the connecting member 5 can be achieved at the same time.

Figure 2:
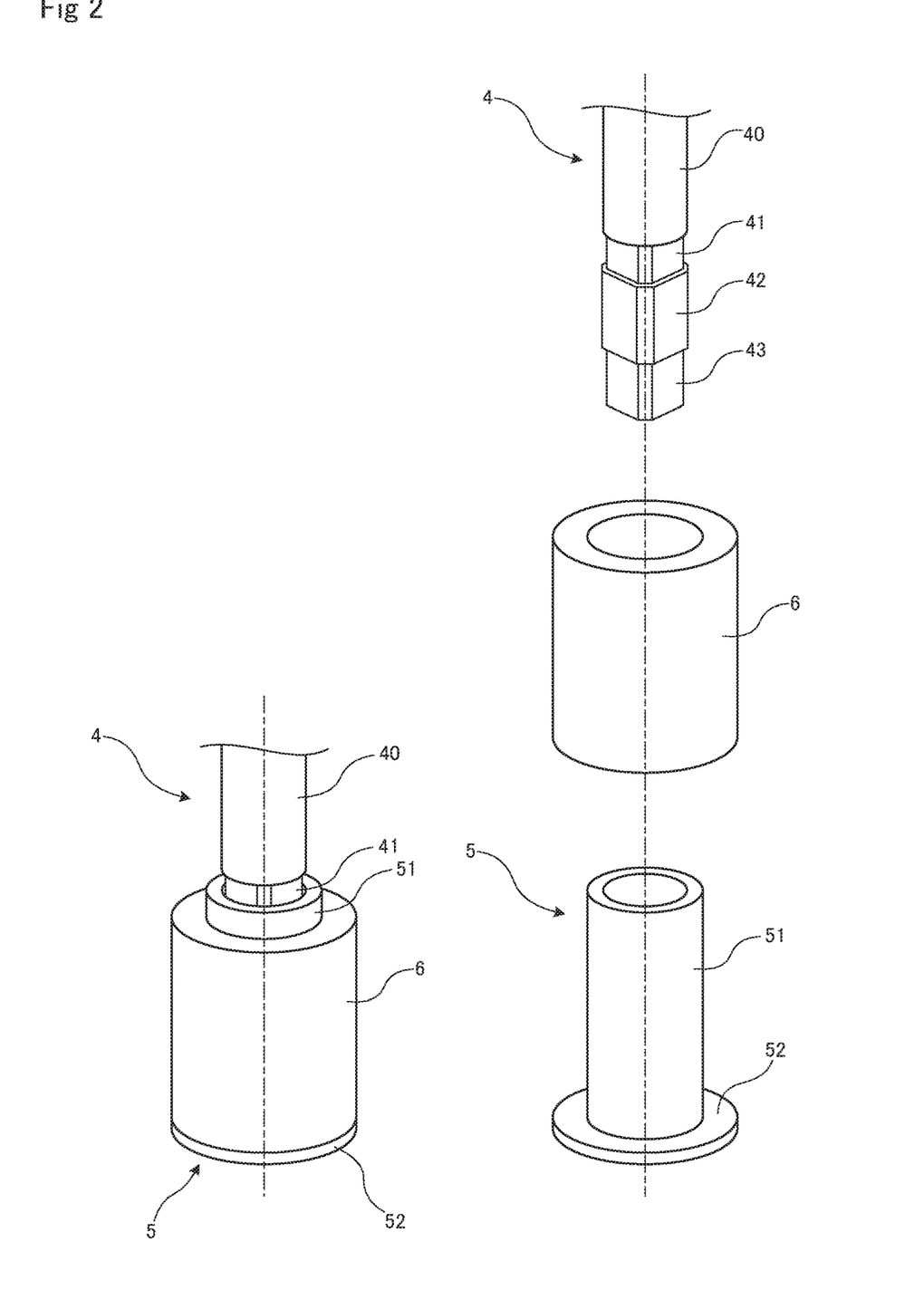
FIG. 2 is a partial perspective view and an exploded perspective view illustrating a connection structure of a terminal pin according to the present embodiment.

Next, with reference to FIGS. 1A, 1B and 2, a connection structure of a terminal pin according to the present embodiment is specifically described. FIG. 2 is a partial perspective view and an exploded perspective view illustrating the connection structure of the terminal pin according to the present embodiment.

As illustrated in FIG. 1B and FIG. 2, the terminal pin 4 is formed in a rod shape that has a circular cross-sectional shape with a predetermined diameter, and extends in a vertical direction. Specifically, the terminal pin 4 has a configuration in which a first reduced diameter part 41, an enlarged diameter part 42, and a second reduced diameter part 43 are formed in this order from the base end side at the top end portion of a column part 40. The first reduced diameter part 41, the enlarged diameter part 42, and the second reduced diameter part 43 are formed in advance by performing working such as pressing on the top end portion of the column part 40.

The column part 40 has an outer diameter greater than the inner diameter of the connecting member 5 (cylindrical part 51) described later. The first reduced diameter part 41 substantially has a rectangular cross-section, and has a maximum outer diameter smaller than the outer diameter of the column part 40 and the inner diameter of the connecting member 5. The enlarged diameter part 42 substantially has a rectangular cross-section, and has a maximum outer diameter greater than the inner diameter of the connecting member 5. In addition, the axial length of the enlarged diameter part 42 is smaller than the length of the connecting member 5. The second reduced diameter part 43 substantially has a rectangular cross-section, and has a maximum outer diameter smaller than the inner diameter of the connecting member 5. Preferably, the axial length of the entirety of the first reduced diameter part 41, the enlarged diameter part 42 and the second reduced diameter part 43 is shorter than the length of the connecting member 5. In this manner, the terminal pin 4 may include a portion (the enlarged diameter part 42) whose width is larger than at least the minimum inner diameter of connecting member 5. Note that the shape of the top end portion of the terminal pin 4 is not limited to the above-mentioned configuration, and may be appropriately modified. For example, the terminal pin 4 may be composed only of the column part 40 having a uniform circular cross-sectional shape. In addition, the cross-sectional shape of the enlarged diameter part 42 may not only be a rectangular shape but also be polygonal shape, or a circular shape. The same applies to the first reduced diameter part 41 and the second reduced diameter part 43. That is, the terminal pin 4 may be formed in any shape as long as it can be inserted or press-fitted to the connecting member 5.

The connecting member 5 includes a cylindrical part 51 extending in a vertical direction and a flange part 52 provided at the lower end of the cylindrical part 51. The cylindrical part 51 has an inner diameter that allows insertion or press-fitting of the terminal pin 4, and more specifically, the cylindrical part 51 may have an inner diameter smaller than the enlarged diameter part 42. The flange part 52 is provided at an end portion of the cylindrical part 51 on the side it is connected with the metal layer 21, and more specifically, the flange part 52 has a ring shape having a diameter enlarged with respect to the cylindrical part 51. When the flange part 52 is joined to the metal layer 21 via the bonding member 50 therebetween, the connecting member 5 is electrically joined to the metal layer 21.

The reinforcement member 6 is composed of a cylindrical member having a length substantially the same as the connecting member 5, and is disposed to cover the outer periphery of the connecting member 5. The reinforcement member 6 is configured such that the reinforcement member 6 can be inserted or press-fitted to the connecting member 5. Specifically, the reinforcement member 6 may have an inner diameter smaller than the outer diameter of the cylindrical part 51. While the entire inner diameter of the reinforcement member 6 is smaller than the outer diameter of the connecting member 5 in the present embodiment, this is not limitative, and at least a part of the inner diameter of the reinforcement member 6 may be smaller than the outer diameter of the connecting member 5. Desirably, the material of the reinforcement member 6 has a lower elastic modulus and a greater tensile strength than those of the material of the connecting member 5.

As illustrated in FIG. 1B, the terminal pin 4 is press-fitted to the inner periphery of the connecting member 5, and the reinforcement member 6 is press-fitted to the outer periphery of the connecting member 5. Specifically, the top end of the terminal pin 4 is inserted (press-fitted) in the connecting member 5 by a predetermined amount. Here, in the order from the metal layer 21 side in the axis direction of the connecting member 5, the region where the terminal pin 4 is not inserted is referred to as a non-insertion region L1, and the region where the terminal pin 4 is inserted is referred to as an insertion region L2. To be more specific, the range from the lower end of the connecting member 5 (the flange part 52) to the lower end of the terminal pin 4 (the second reduced diameter part 43) inserted inside the connecting member 5 is the non-insertion region L1, and the range from the lower end of the terminal pin 4 to the upper end of the connecting member 5 is the insertion region L2. In the insertion region L2, deformation of the connecting member 5 in the case where the terminal pin 4 (the enlarged diameter part 42) is press-fitted to the connecting member 5 can be suppressed with the reinforcement member 6. Thus, the adhesion between the terminal pin 4 and the connecting member 5 can be ensured. In the non-insertion region L1, the intimate contact between the connecting member 5 and the reinforcement member 6 improves the conductivity. Regarding the press-fitting operation, it is possible to perform one or both of an operation of press-fitting the terminal pin 4 to the inner periphery of the connecting member 5, and an operation of press-fitting the reinforcement member 6 to the outer periphery of the connecting member 5.

In addition, preferably, the outer peripheral surface of the connecting member 5 and/or the inner peripheral surface of the reinforcement member 6 are plated with nickel, tin and the like. For example, with tin-plating, the plated portion melts upon heating, and adhesion is improved by chemical coupling between the outer peripheral surface of the connecting member 5 and the inner peripheral surface of the reinforcement member 6. As a result, a current easily flows not only through the connecting member 5, but also through the reinforcement member 6, and Joule heat can be further reduced by reducing the electric resistance. Note that, both the connecting member 5 and the reinforcement member 6 may be plated, or only one of the connecting member 5 and the reinforcement member 6 may be plated. In addition, is it preferable to set the plating thickness to a thickness that can fill-in a slight gap between the connecting member 5 and the reinforcement member 6 at the time of the press-fitting with the molten plate. Thus, the chemical adhesion between the connecting member 5 and the reinforcement member 6 can be further improved.

Next, with reference to FIGS. 3A to 3D, a method of manufacturing a semiconductor device according to an aspect of the present embodiment is described. FIGS. 3A to 3D are schematic views illustrating a method of manufacturing a semiconductor device according to an aspect of the present embodiment. FIGS. 3A to 3D are transition diagrams illustrating insertion of the terminal pin 4 into the connecting member 5. Note that the method of manufacturing the semiconductor device described below is merely an example, and the method is not limited to the described configuration and may be appropriately modified.

As illustrated in FIGS. 3A to 3D, the method of manufacturing a semiconductor device according to an aspect of the present embodiment includes a step of preparing the insulation circuit substrate 2, a step of preparing the terminal pin 4, a step of preparing the connecting member 5, a step of preparing the reinforcement member 6, a reinforcement member disposing step of fitting the reinforcement member 6 to the outer periphery of the connecting member 5, a connecting member disposing step of disposing the connecting member 5 on the metal layer 21, a joining step of joining the connecting member 5 to the metal layer, and a terminal pin press-fitting step of press-fitting the terminal pin 4.

Figure 3A:
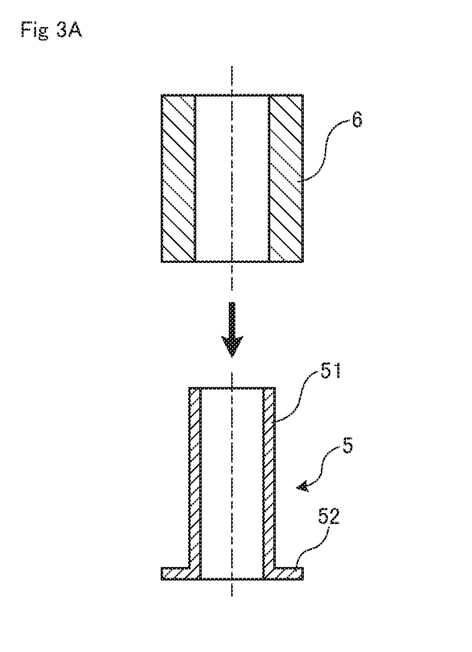
FIGS. 3A to 3D are schematic views illustrating a method of manufacturing a semiconductor device according to an aspect of the present embodiment.

First, the insulation circuit substrate 2, the terminal pin 4, the connecting member 5 and the reinforcement member 6 are prepared in advance. Then, the reinforcement member disposing step is performed. In the reinforcement member disposing step, the reinforcement member 6 is fitted to the outer periphery of the connecting member 5 (the cylindrical part 51) as illustrated in FIG. 3A. Specifically, the reinforcement member 6 is press-fitted until the one end (lower end) makes contact with the upper surface of the flange part 52. Since the inner diameter of the reinforcement member 6 is smaller than the outer diameter of the connecting member 5 and the connecting member 5 is relatively softer than the reinforcement member 6, the connecting member 5 is compressed radially inward.

Figure 3B:
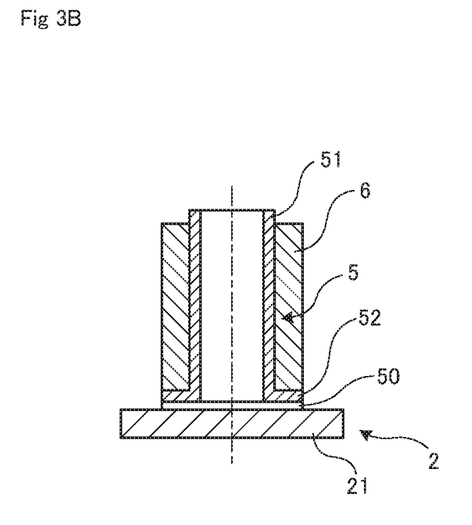

Next, the connecting member disposing step is performed. In the connecting member disposing step, the connecting member 5 fitted with the reinforcement member 6 is disposed on the metal layer 21 as illustrated in FIG. 3B. Specifically, the flange part 52 is placed on the metal layer 21 via the bonding member 50. The bonding member 50 is disposed in a circular shape along the outer diameter of the flange part 52. Since the flange part 52 ensures the contact area with the metal layer 21 via the bonding member 50, the orientation of the connecting member 5 is stabilized, and the adhesion with the metal layer 21 can be ensured.

Next, the joining step is performed. In the joining step, the bonding member 50 is heated and melted, and thereafter cooled and solidified to join the connecting member 5 to the metal layer 21. For example, the insulation circuit substrate 2 of the state illustrated in FIG. 3B is put in a furnace, and heated to a melting temperature of the bonding member 50. The bonding member 50 is melted, and a fillet is formed between the flange part 52 and the metal layer 21 (see FIG. 3C). Thereafter, cooling and solidifying are performed, and thus the connecting member 5 is electrically connected to the metal layer 21.

Figure 3C:
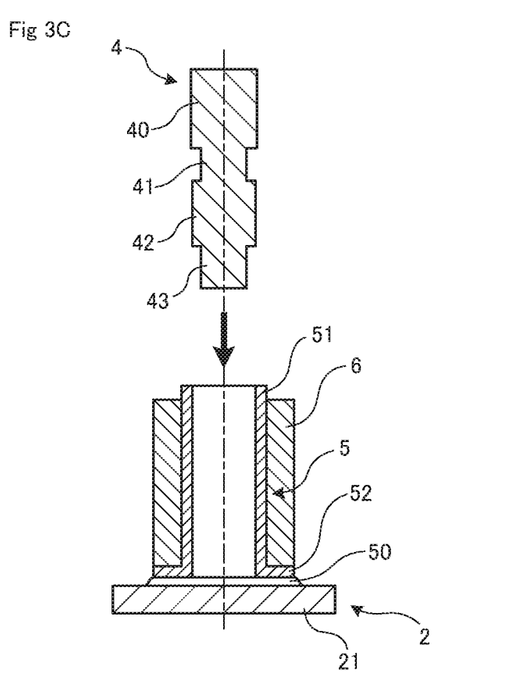
Figure 3D:
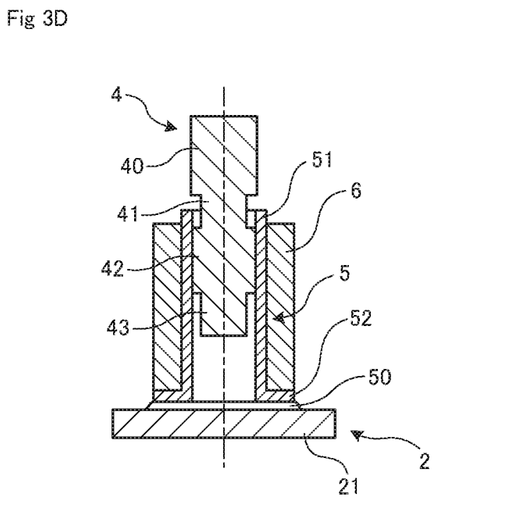

Next, the terminal pin press-fitting step is performed. In the terminal pin press-fitting step, the terminal pin 4 is press-fitted to the connecting member 5 fixed on the metal layer 21 as illustrated in FIG. 3C. As illustrated in FIG. 3D, the top end of the terminal pin 4 is pushed into the cylindrical part 51 from the opening edge of the cylindrical part 51 to a predetermined depth. At this time, the terminal pin 4 is pushed into the cylindrical part 51 while the enlarged diameter part 42 makes contact with the inner surface of the cylindrical part 51. As a result, the terminal pin 4 and the connecting member 5 are electrically connected with each other. Since the outer periphery of the cylindrical part 51 is covered with the reinforcement member 6, deformation of the cylindrical part 51 is suppressed as much as possible. Through the above-mentioned steps, the terminal pin 4 and the insulation circuit substrate 2 are electrically connected with each other.

Next, with reference to FIGS. 4A to 4D, a method of manufacturing a semiconductor device according to another aspect of the embodiment is described. FIGS. 4A to 4D are schematic views illustrating a method of manufacturing a semiconductor device according to another aspect of the embodiment. FIGS. 4A to 4D are transition diagrams illustrating insertion of the terminal pin 4 into the connecting member 5. Note that, the method of manufacturing a semiconductor device described below differs from FIGS. 3A to 3D in the order of the steps, and the configurations thereof are the same as those of FIGS. 3A to 3D. Therefore, overlaps are appropriately omitted.

As illustrated in FIGS. 4A to 4D, the method of manufacturing a wiring substrate according to the present embodiment includes a step of preparing the insulation circuit substrate 2, a step of preparing the terminal pin 4, a step of preparing the connecting member 5, a step of preparing the reinforcement member 6, a connecting member disposing step of disposing the connecting member 5 on the metal layer 21, a joining step of joining the connecting member 5 to the metal layer 21, a terminal pin disposing step of inserting the terminal pin 4 to the connecting member 5, and a reinforcement member press-fitting step of press-fitting the reinforcement member 6.

Figure 4A:
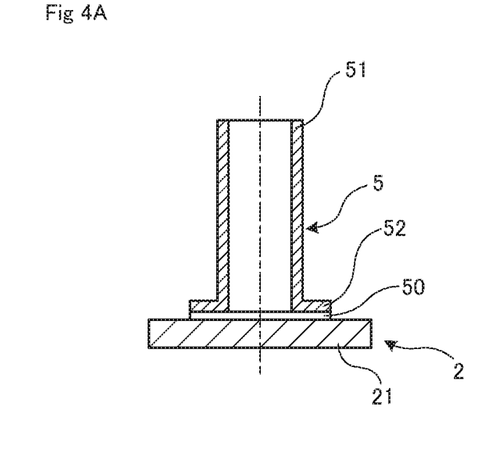
FIGS. 4A to 4D are schematic views illustrating a method of manufacturing a semiconductor device according to another aspect of the embodiment.

First, the insulation circuit substrate 2, the terminal pin 4, the connecting member 5 and the reinforcement member 6 are prepared in advance. Then, the connecting member disposing step is performed. In the connecting member disposing step, the connecting member 5 is disposed on the metal layer 21 as illustrated in FIG. 4A. Specifically, the flange part 52 is placed on the metal layer 21 via the bonding member 50.

Next, the joining step is performed. In the joining step, the bonding member 50 is heated and melted, and thereafter cooled and solidified to join the connecting member 5 to the metal layer 21. For example, the insulation circuit substrate 2 of the state illustrated in FIG. 4A is put in a furnace, and heated to a melting temperature of the bonding member 50. The bonding member 50 is melted, and a fillet is formed between the flange part 52 and the metal layer 21 (see FIG. 4B). Thereafter, cooling and solidifying are performed, and thus the connecting member 5 is electrically connected to the metal layer 21.

Figure 4B:
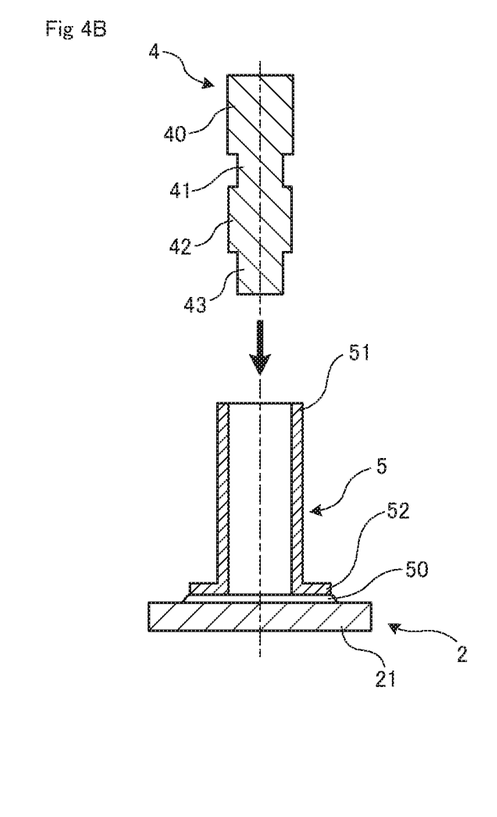

Next, the terminal pin disposing step is performed. In the terminal pin disposing step, the terminal pin 4 is inserted to the connecting member 5 fixed on the metal layer 21 as illustrated in FIG. 4B. The top end of the terminal pin 4 is pushed into the cylindrical part 51 from the opening edge of the cylindrical part 51 to a predetermined depth. At this time, the terminal pin 4 is pushed into the cylindrical part 51 while the enlarged diameter part 42 makes contact with the inner surface of the cylindrical part 51. As a result, the terminal pin 4 and the connecting member 5 are electrically connected with each other.

Figure 4C:
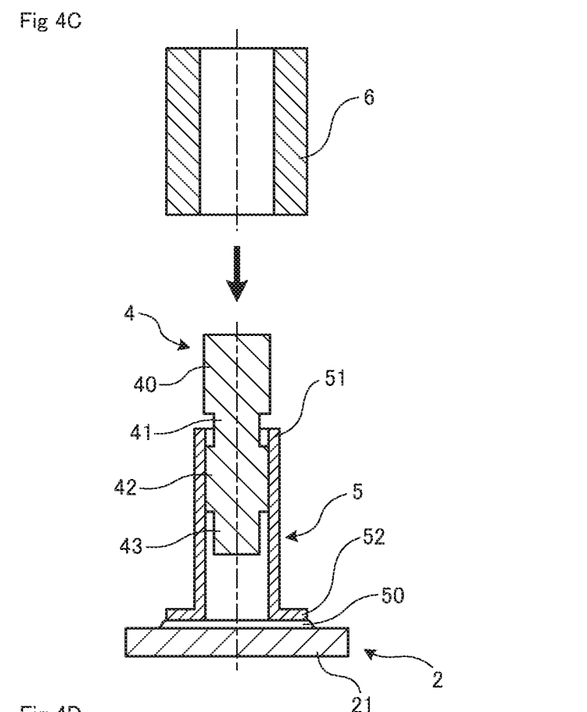
Figure 4D:
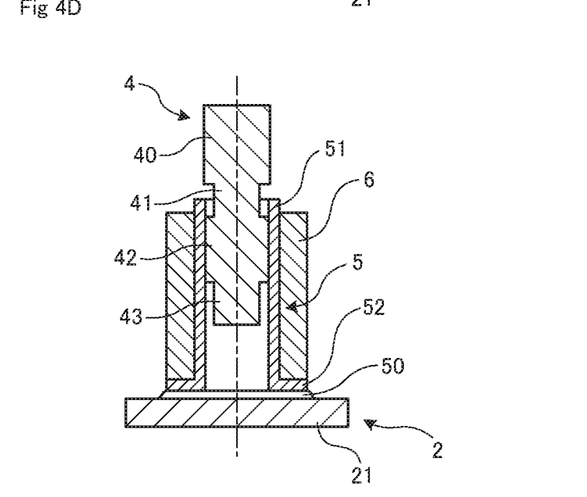

Next, the reinforcement member disposing step is performed. In the reinforcement member disposing step, the reinforcement member 6 is press-fitted to the outer periphery of the connecting member 5 (the cylindrical part 51) in which the terminal pin 4 is inserted as illustrated in FIG. 4C. Specifically, the reinforcement member 6 is press-fitted until the one end (lower end) makes contact with the upper surface of the flange part 52 (see FIG. 4D). Since the inner diameter of the reinforcement member 6 is smaller than the outer diameter of the connecting member 5 and the connecting member 5 is relatively softer than the reinforcement member 6, the connecting member 5 is compressed radially inward. Thus, the adhesion between the terminal pin 4 and the connecting member 5 is improved. Through the above-mentioned steps, the terminal pin 4 and the insulation circuit substrate 2 are electrically connected with each other.

As described above, while the order of disposing the reinforcement member 6 to the outer periphery of the connecting member 5 is different between FIGS. 3A to 3D and FIGS. 4A to 4D, the adhesion between the terminal pin 4 and the connecting member 5 can be augmented with the relatively hard reinforcement member 6 in each case.

Figure 5:
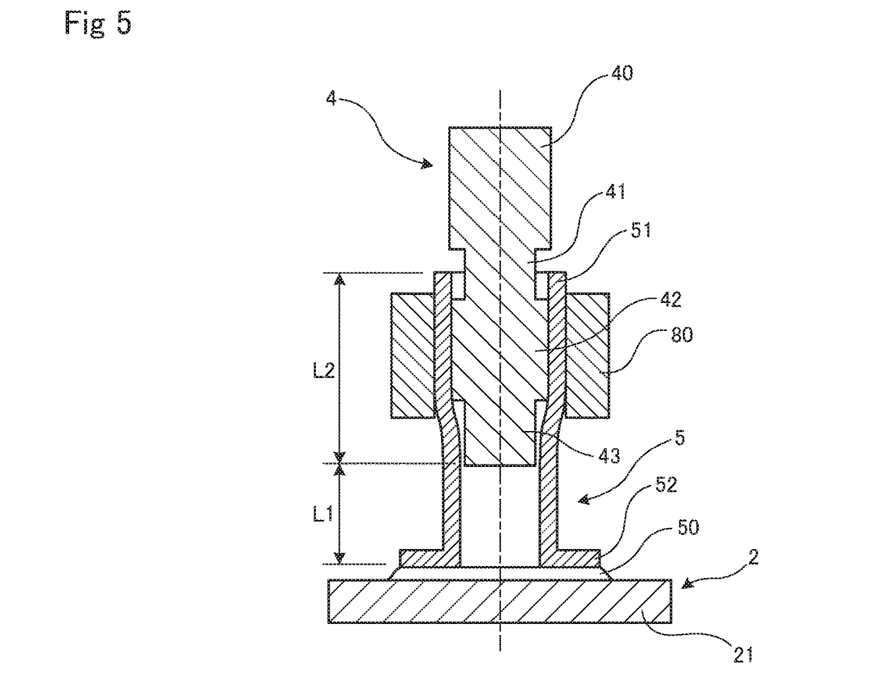
FIG. 5 is a schematic view illustrating a connection structure of a terminal pin according to a first modification.
Figure 6:
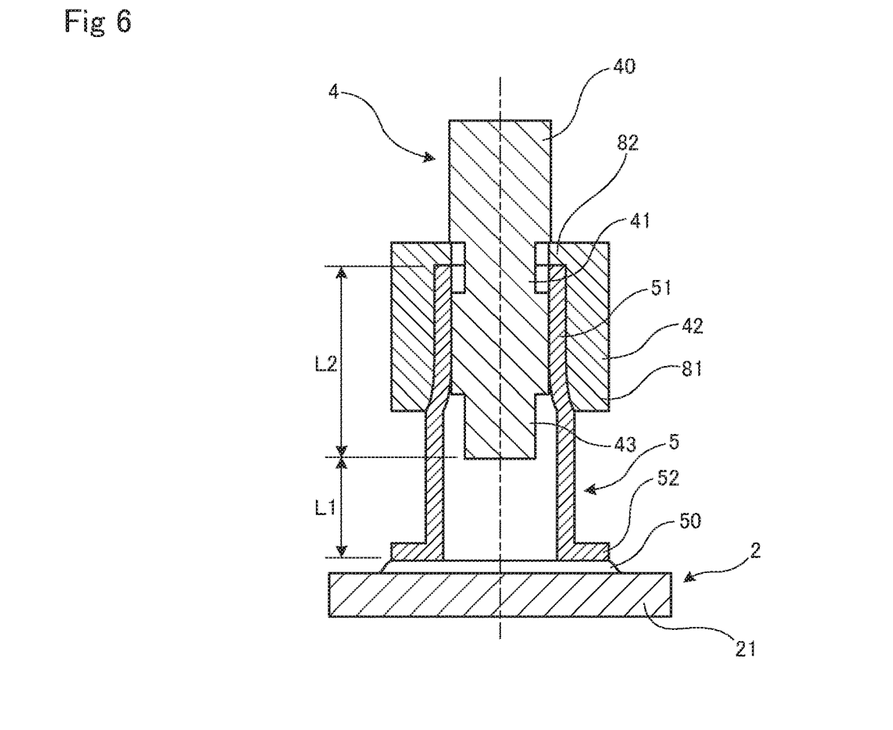
FIG. 6 is a schematic view illustrating a connection structure of a terminal pin according to a second modification.
Figure 7:
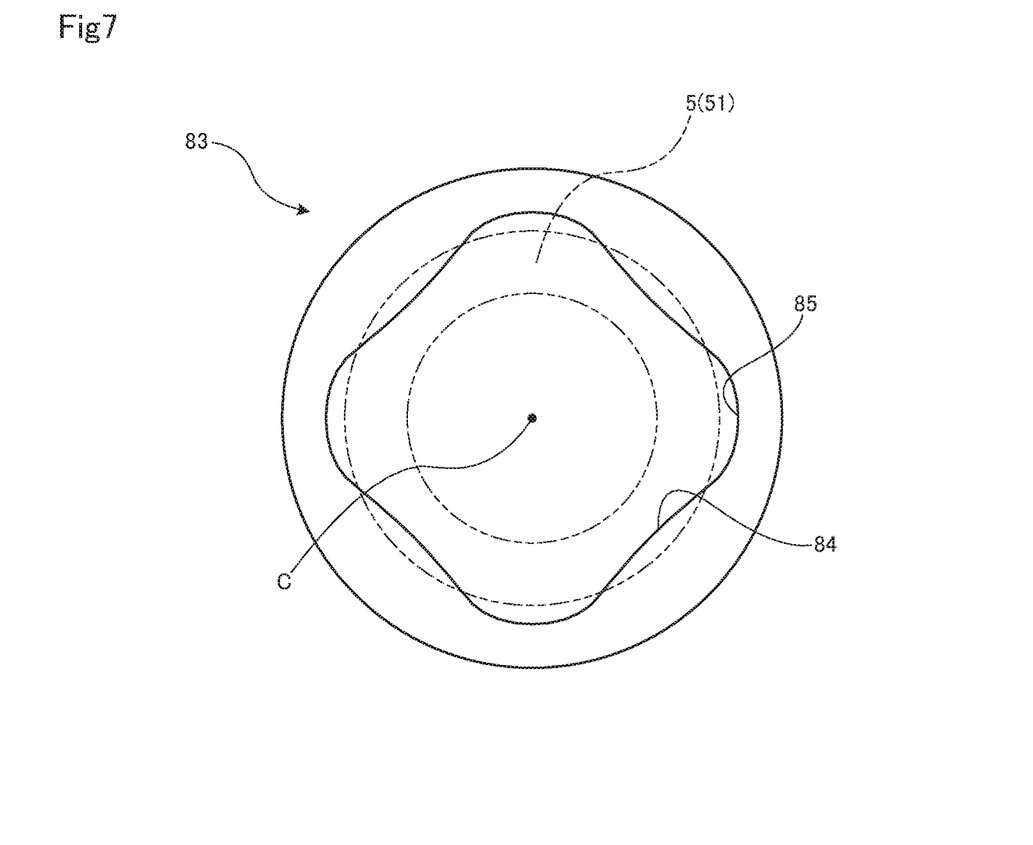
FIG. 7 is a schematic view illustrating a connection structure of a terminal pin according to a third modification.

Next, with reference to FIG. 5 to FIG. 7, modifications are described. FIG. 5 is a schematic view illustrating a connection structure of a terminal pin according to a first modification. FIG. 6 is a schematic view illustrating a connection structure of a terminal pin according to a second modification. FIG. 7 is a schematic view illustrating a connection structure of a terminal pin according to a third modification.

While the reinforcement member 6 has a length corresponding to the length of the connecting member 5 in the present embodiment, this configuration is not limitative. It is also possible to adopt a configuration illustrated in FIG. 5. In FIG. 5, characteristically, the axial length of a reinforcement member 80 covers the outer periphery of the connecting member 5 in the insertion region L2. To be more specific, the reinforcement member 80 corresponds to the length of the enlarged diameter part 42. With this configuration, the length of the reinforcement member 80 can be reduced and the cost for the components can be reduced while ensuring the adhesion between the terminal pin 4 and the connecting member 5.

In addition, FIG. 5 illustrates a state where the terminal pin 4 is press-fitted to the insertion region L2 of the connecting member 5 by the method illustrated in FIGS. 3A to 3D, and the inner diameter of the non-insertion region L1 is smaller than the maximum inner diameter of the insertion region L2 in the connecting member 5 (the cylindrical part 51). With this configuration, with the terminal pin 4 press-fitted with the connecting member 5, the electrical and mechanical connection (adhesion) between the terminal pin 4 and the connecting member 5 can be strengthened.

In FIG. 5, in some situation the insertion amount of the reinforcement member 80 may be difficult to adjust. In view of this, in FIG. 6, characteristically, a reinforcement member 81 includes a stopper part 82 for limiting the insertion depth with respect to the connecting member 5. To be more specific, the stopper part 82 is composed of a ring-shaped flange protruding radially inward at the upper end side of the cylindrical reinforcement member 81. When the reinforcement member 81 is inserted (press-fitted) to the connecting member 5, the stopper part 82 makes contact with the upper end of the cylindrical part 51, and thus the insertion depth of the reinforcement member 81 is limited. As a result, the reinforcement member 81 can be disposed in the insertion region L2.

In addition, FIG. 6 illustrates a state where the reinforcement member 81 is press-fitted to the connecting member 5 after the terminal pin 4 is inserted to the connecting member 5 by the method illustrated in FIGS. 4A to 4D, and the inner diameter of the non-insertion region L1 is larger than the minimum inner diameter of the insertion region L2 in the connecting member 5. With this configuration, with the reinforcement member 81 press-fitted to the outer periphery of the insertion region L2, the electrical and mechanical connection (adhesion) between the terminal pin 4 and the connecting member 5 can be strengthened.

While the reinforcement members 6, 80 and 81 have a uniform circular cross-section in the present embodiment, this configuration is not limitative. For example, the configuration illustrated in FIG. 7 may also be adopted. FIG. 7 is a plan view of a reinforcement member 83 as viewed in the axial direction. The inner periphery of the reinforcement member 83 does not have a circular shape, but has a configuration in which, with respect to the outer periphery of the connecting member 5, four protrusions 84 protruding radially inward and four recesses 85 recessed radially outward are alternately disposed. Since the distance between of a pair of the protrusions 84 opposite to each other with a center C of the reinforcement member 83 therebetween is smaller than the outer diameter of the connecting member 5, the reinforcement member 83 can be press-fitted to the connecting member 5. Note that, in this case, the adhesion between the terminal pin 4 and the connecting member 5 may be further improved by swaging the outer periphery of the reinforcement member 83 radially inward after the press-fitting. Note that, the number of each of the protrusion 84 and the recess 85 is not limited to four, and may be appropriately modified.

In addition, while one terminal pin 4 is connected with the insulation circuit substrate 2 in the present embodiment, this configuration is not limitative. Two or more terminal pins 4 may be disposed.

In addition, while Vickers hardness is used as the index indicating the hardness in the present embodiment, this is not limitative. For example, various indices of the hardness of materials such as Rockwell hardness, Brinell hardness, and Shore hardness may be adopted. In addition, the elastic modulus and the tensile strength can be acquired by pulling a test piece and measuring the displacement amount and the tensile force of the pulled test piece. For example, the tensile strength can be measured in accordance with JIS Z2241 "Tensile Test Method for Metal Material" or ISO 6892 "Metallic materials-Tensile testing". The elastic modulus and the tensile strength are measured at a maximum use temperature of a semiconductor device. The elastic modulus (static Young's modulus) corresponds to an inclination of a straight line in a stress-strain curve with the ordinate representing the stress and the abscissa representing the strain. To be more specific, the measurement can be performed based on measurement methods of high-temperature Young's modulus of static Young's modulus test methods of JIS Z 2280 (Young's modulus of metal materials).

In addition, while the present embodiment and the modifications have been described above, the present embodiment and the modifications may be combined in part or in its entirety as another embodiment.

In addition, the present embodiment is not limited to the above-mentioned embodiment and modifications, and various modifications, combinations, sub-combinations and alterations may occur within the gist of the technical ideas. Further, the technical ideas may be implemented by other means in accordance with technical progresses or other derivative techniques. Accordingly, the scope of the appended claims encompasses all aspects of the embodiments that can be included in the range of the technical ideas.

The features of the present embodiment are as follows.

A semiconductor device according to the present embodiment includes: an insulation circuit substrate in which a metal layer is formed on one surface of an insulation substrate; a connecting member having a cylindrical shape joined to the metal layer via an interposed bonding member; a terminal pin inserted in the connecting member; and a reinforcement member having a cylindrical shape disposed on an outer periphery of the connecting member. The reinforcement member is made of a material harder than that of the connecting member.

In addition, in the semiconductor device according to the present embodiment, a Vickers hardness of the material of the reinforcement member is higher than that of a material of the connecting member.

In addition, in the semiconductor device according to the present embodiment, the material of the reinforcement member has an elastic modulus lower than that of the material of the connecting member, and the material of the reinforcement member has a tensile strength greater than that of the material of the connecting member.

In addition, in the semiconductor device according to the present embodiment, a material of the connecting member is composed of copper or a copper-containing metal.

In addition, in the semiconductor device according to the present embodiment, the terminal pin includes a portion whose width is larger than a minimum inner diameter of the connecting member.

In addition, in the semiconductor device according to the present embodiment, the reinforcement member has an inner diameter including a portion smaller than an outer diameter of the connecting member.

In addition, in the semiconductor device according to the present embodiment, the connecting member has a conductivity higher than that of the reinforcement member.

In addition, in the semiconductor device according to the present embodiment, the connecting member includes a flange part at an end portion of the connecting member, the end portion being located on a side on which the connecting member is joined to the metal layer.

In addition, in the semiconductor device according to the present embodiment, the connecting member includes a non-insertion region and an insertion region in this order from a side of the metal layer, the non-insertion region being a region where the terminal pin is not inserted, the insertion region being a region where the terminal pin is inserted, and the reinforcement member has a length that covers the insertion region.

In addition, in the semiconductor device according to the present embodiment, the reinforcement member includes a stopper part that limits an insertion depth with respect to the connecting member.

In addition, in the semiconductor device according to the present embodiment, the terminal pin is press-fitted in the insertion region of the connecting member; and in the connecting member, the non-insertion region has an inner diameter smaller than a maximum inner diameter of the insertion region.

In addition, in the semiconductor device according to the present embodiment, the reinforcement member is press-fitted to an outer periphery of the connecting member, and in the connecting member, the non-insertion region has an inner diameter larger than a minimum inner diameter of the insertion region.

In addition, in the semiconductor device according to the present embodiment, an outer peripheral surface of the connecting member and/or an inner peripheral surface of the reinforcement member is provided with plating.

In addition, in the semiconductor device according to the present embodiment, the plating has a thickness that fills a gap between the connecting member and the reinforcement member.

In addition, in a method of manufacturing a semiconductor device according to the present embodiment includes: preparing an insulation circuit substrate in which a metal layer is formed on one surface of an insulation substrate; preparing a terminal pin; preparing a connecting member having a cylindrical shape; preparing a reinforcement member having a cylindrical shape made of a material harder than that of the connecting member; fitting the reinforcement member to an outer periphery of the connecting member; disposing the connecting member to which the reinforcement member is fitted on the metal layer via an interposed bonding member; joining the connecting member to the metal layer by heating and melting the bonding member and then cooling and solidifying the bonding member; and press-fitting the terminal pin to the connecting member fixed to the metal layer.

In addition, in a method of manufacturing a semiconductor device according to the present embodiment includes: preparing an insulation circuit substrate in which a metal layer is formed on one surface of an insulation substrate; preparing a terminal pin; preparing a connecting member having a cylindrical shape; preparing a reinforcement member having a cylindrical shape made of a material harder than that of the connecting member; disposing the connecting member on the metal layer via an interposed bonding member; joining the connecting member to the metal layer by heating and melting the bonding member and then cooling and solidifying the bonding member; inserting the terminal pin to the connecting member fixed to the metal layer; and press-fitting the reinforcement member to an outer periphery of the connecting member in which the terminal pin is inserted.

As described above, the present invention provides an effect of ensuring adhesion between a terminal pin and a connecting member to which the terminal pin is inserted, and in particular, the present invention is suitable for a semiconductor device and a method of manufacturing a semiconductor device.

REFERENCE SIGNS LIST

1: Semiconductor device
2: Insulation circuit substrate
3: Semiconductor chip
4: Terminal pin
5: Connecting member
6: Reinforcement member
7: Sealing member
20: Insulation substrate
21: Metal layer 22: Metal layer
30: Bonding member
40: Column part
41: First reduced diameter part
42: Enlarged diameter part
43: Second reduced diameter part
50: Bonding member
51: Cylindrical part
52: Flange part
80: Reinforcement member
81: Reinforcement member
82: Stopper part
83: Reinforcement member
84: Protrusion
85: Recess
C: Center
L1: Non-insertion region
L2: Insertion region

What is claimed is:

1. A semiconductor device, comprising:
an insulation circuit substrate including an insulation substrate and a metal layer, the metal layer being provided on one surface of the insulation substrate;
a connecting member having a tubular shape, joined to the metal layer via a bonding material;
a terminal pin inserted in the connecting member; and
a reinforcement member having a tubular shape, disposed on an outer periphery of the connecting member, the reinforcement member being made of a material having a hardness greater than a hardness of a material of the connecting member.

2. The semiconductor device according to claim 1, wherein a Vickers hardness of the material of the reinforcement member is greater than a Vickers hardness of the material of the connecting member.

3. The semiconductor device according to claim 2, wherein
the material of the reinforcement member has an elastic modulus lower than an elastic modulus of the material of the connecting member, and
the material of the reinforcement member has a tensile strength greater than a tensile strength of the material of the connecting member.

4. The semiconductor device according to claim 1, wherein the connecting member comprises copper.

5. The semiconductor device according to claim 1, wherein the terminal pin has a width greater than a minimum inner diameter of the connecting member.

6. The semiconductor device according to claim 1, wherein the reinforcement member has an inner diameter smaller than an outer diameter of the connecting member.

7. The semiconductor device according to claim 1, wherein the connecting member has a conductivity greater than a conductivity of the reinforcement member.

8. The semiconductor device according to claim 1, wherein the connecting member includes a flange part at an end of the connecting member, the end of the connecting member being located on a side on which the connecting member is joined to the metal layer.

9. The semiconductor device according to claim 1, wherein
the connecting member includes a non-insertion region and an insertion region in this order from a side of the metal layer, the non-insertion region being a region where the terminal pin is not inserted, the insertion region being a region where the terminal pin is inserted, and
the reinforcement member has a length that covers the insertion region.

10. The semiconductor device according to claim 9, wherein
the reinforcement member includes a stopper part that limits insertion of the terminal pin into the connecting member only to an inserting length.

11. The semiconductor device according to claim 9, wherein
the terminal pin is press-fitted in the insertion region of the connecting member, and
in the connecting member, the non-insertion region has an inner diameter smaller than a maximum inner diameter of the insertion region.

12. The semiconductor device according to claim 9, wherein
the reinforcement member is press-fitted to an outer periphery of the connecting member, and
in the connecting member, the non-insertion region has an inner diameter larger than a minimum inner diameter of the insertion region.

13. The semiconductor device according to claim 1, wherein an outer peripheral surface of the connecting member and/or an inner peripheral surface of the reinforcement member is covered with plating.

14. The semiconductor device according to claim 13, wherein there is a gap between the connecting member and the reinforcement member, and
the plating has a thickness equal to a width of the gap so that the plating fills the gap.

15. The semiconductor device according to claim 1, wherein the connecting member comprises a copper alloy.

16. A semiconductor device, comprising:
an insulation circuit substrate including an insulation substrate and a metal layer, the metal layer being provided on one surface of the insulation substrate;
a connecting member having a cylindrical shape, joined to the metal layer via a bonding material;
a terminal pin inserted in the connecting member; and
a reinforcement member having a cylindrical shape, disposed on an outer periphery of the connecting member, the reinforcement member being made of a material having a hardness greater than a hardness of a material of the connecting member, wherein
a Vickers hardness of the material of the reinforcement member is greater than a Vickers hardness of the material of the connecting member.

17. A semiconductor device, comprising:
an insulation circuit substrate including an insulation substrate and a metal layer, the metal layer being provided on one surface of the insulation substrate;
a connecting member having a cylindrical shape, joined to the metal layer via a bonding material;
a terminal pin inserted in the connecting member; and
a reinforcement member having a cylindrical shape, disposed on an outer periphery of the connecting member, the reinforcement member being made of a material having a hardness greater than a hardness of a material of the connecting member, wherein
the terminal pin has a width greater than a minimum inner diameter of the connecting member.

* * * * *